United States Patent
Lee et al.

(10) Patent No.: US 9,025,384 B2
(45) Date of Patent: May 5, 2015

(54) MEMORY SYSTEM AND OPERATING METHOD OF CONTROLLER

(71) Applicant: Samsung Electronics Co., Ltd., Suwon-si, Gyeonggi-do (KR)

(72) Inventors: ChulHo Lee, Suwon-si (KR); Eun-Jin Yun, Suwon-si (KR); BoGeun Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 169 days.

(21) Appl. No.: 13/738,983

(22) Filed: Jan. 10, 2013

(65) Prior Publication Data
US 2013/0265826 A1      Oct. 10, 2013

(30) Foreign Application Priority Data
Apr. 9, 2012    (KR) .................. 10-2012-0036626

(51) Int. Cl.
| | |
|---|---|
| *G11C 16/04* | (2006.01) |
| *G11C 16/10* | (2006.01) |
| *G11C 13/00* | (2006.01) |
| *G11C 16/26* | (2006.01) |
| *G06F 13/16* | (2006.01) |
| *G11C 11/16* | (2006.01) |

(52) U.S. Cl.
CPC ............ *G11C 16/10* (2013.01); *G11C 13/0069* (2013.01); *G11C 11/1673* (2013.01); *G11C 13/0004* (2013.01); *G11C 13/004* (2013.01); *G11C 16/26* (2013.01); *G11C 11/1675* (2013.01); *G06F 13/1694* (2013.01)

(58) Field of Classification Search
CPC .. G11C 16/10; G11C 13/0069; G11C 13/004; G11C 16/26; G11C 11/1675; G11C 11/1673
USPC .......... 365/185.17, 185.23, 185.18, 171, 158, 365/185.01, 189.05
See application file for complete search history.

(56) References Cited

U.S. PATENT DOCUMENTS

| | | | | |
|---|---|---|---|---|
| 7,245,527 | B2 * | 7/2007 | Qureshi et al. ................ | 365/171 |
| 7,523,274 | B2 | 4/2009 | Ryu et al. | |
| 8,250,282 | B2 * | 8/2012 | Confalonieri et al. ........ | 711/100 |
| 8,331,175 | B2 * | 12/2012 | Bang et al. .................... | 365/201 |
| 8,441,836 | B2 * | 5/2013 | Parkinson et al. ............ | 365/148 |
| 2004/0213350 | A1 | 10/2004 | Frith et al. | |
| 2009/0268513 | A1 | 10/2009 | De Ambroggi et al. | |
| 2010/0091596 | A1 * | 4/2010 | Bang et al. .................... | 365/201 |
| 2010/0191898 | A1 | 7/2010 | Kim et al. | |
| 2010/0250798 | A1 | 9/2010 | Eilert | |
| 2010/0262759 | A1 | 10/2010 | Borchers et al. | |
| 2010/0293317 | A1 | 11/2010 | Confalonieri et al. | |
| 2010/0318718 | A1 | 12/2010 | Eilert et al. | |

* cited by examiner

*Primary Examiner* — Gene Auduong
(74) *Attorney, Agent, or Firm* — Renaissance IP Law Group LLP

(57) ABSTRACT

A memory system including a first memory of a first type; a second memory of a second type; and a controller configured to control the first memory and the second memory. The first type and second type are different, and the controller is configured to control the first memory and the second memory according to substantially the same command sequence.

20 Claims, 15 Drawing Sheets

Fig. 2

| DQ | Data inputs/outputs (x8,x16,x32,⋯) |
|---|---|
| CLE | Command latch enable |
| ALE | Address latch enable |
| nCE | Chip enable |
| nRE | Read enable |
| nWE | Write enable |
| DQS | Data strobe |

MEMORY SYSTEM AND OPERATING METHOD OF CONTROLLER

CROSS-REFERENCE TO RELATED APPLICATIONS

A claim for priority under 35 U.S.C §119 is made to Korean Patent Application No. 10-2012-0036626 filed Apr. 9, 2012, the entirety of which is incorporated by reference herein.

BACKGROUND

The inventive concepts described herein relate to a semiconductor memory device, and more particularly, relate to a memory system and a method of operating a controller.

A semiconductor memory device is a memory device which is fabricated using semiconductors such as silicon (Si), germanium (Ge), gallium arsenide (GaAs), indium phosphide (InP), and the like. Semiconductor memory devices are classified into volatile memory devices and nonvolatile memory devices.

The volatile memory devices may lose stored contents at power-off The volatile memory devices include a static RAM (SRAM), a dynamic RAM (DRAM), a synchronous DRAM (SDRAM), and the like. The nonvolatile memory devices may retain stored contents even at power-off. The nonvolatile memory devices include a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), and the like. The flash memory device is roughly divided into a NOR type and a NAND type.

SUMMARY

An embodiment includes a memory system including a first memory of a first type; a second memory of a second type; and a controller configured to control the first memory and the second memory. The first type and second type are different, and the controller is configured to control the first memory and the second memory according to substantially the same command sequence.

An embodiment includes a memory device including a memory cell array of a first type; control circuitry configured to control the memory cell array; and an interface converter coupled to the control circuitry and configured to convert between commands associated with a memory cell array of a second type into commands associated with the memory cell of the first type. The first type and second type are different.

An embodiment includes a method including communicating between a controller and a first memory having a first type according to a first command sequence associated with the first type; and communicating between the controller and a second memory having a second type according to a second command sequence associated with the first type. The first type and second type are different.

BRIEF DESCRIPTION OF THE SEVERAL VIEWS OF THE DRAWINGS

Embodiments will be described with reference to the following figures, wherein like reference numerals refer to like parts throughout the various figures unless otherwise specified, and wherein

FIG. 2 is a table illustrating signals exchanged between a controller and different types of memories according to an embodiment.

DETAILED DESCRIPTION

Figure 1:
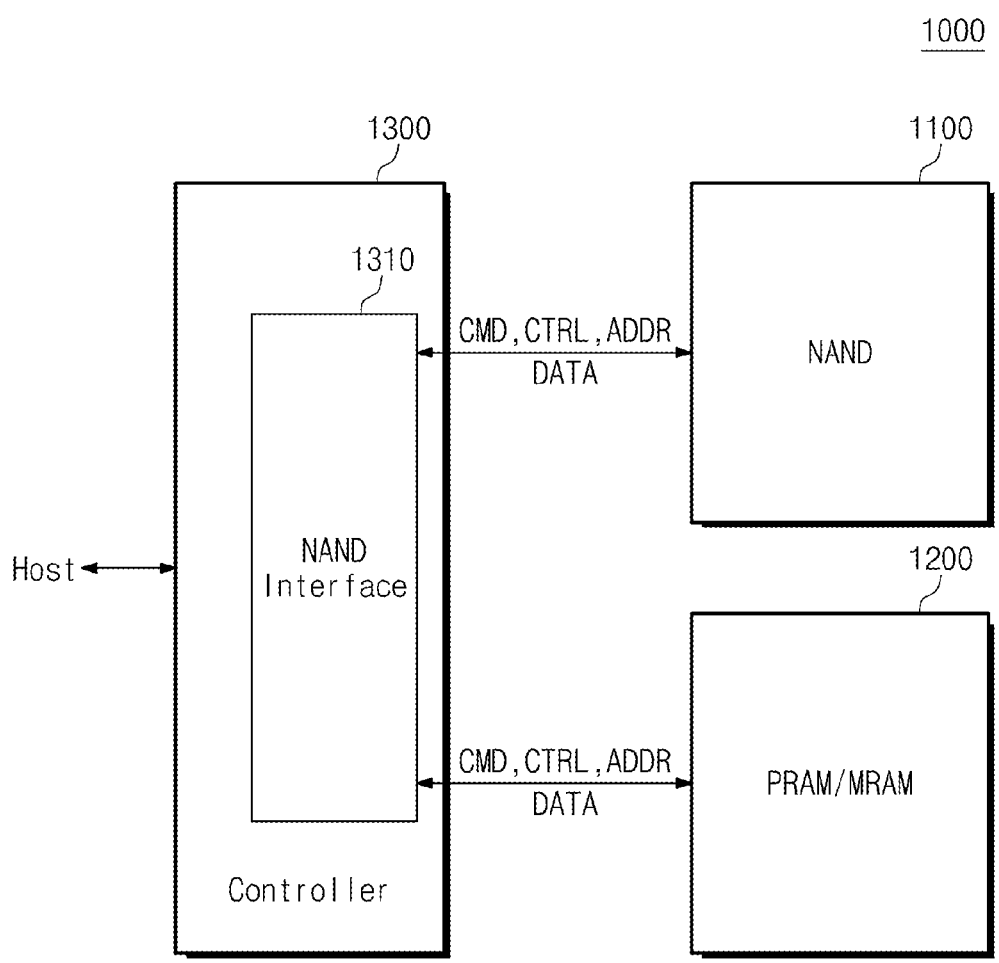
FIG. 1 is a block diagram schematically illustrating a memory system according to an embodiment.

Embodiments are described more fully hereinafter with reference to the accompanying drawings. Embodiments may take many different forms and should not be construed as limited to the particular embodiments set forth herein. Rather, these embodiments are provided so that this disclosure will be thorough and complete, and will fully convey the scope of the claims to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings herein.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, or the like, but do not preclude the presence or addition of one or more other features, integers, steps, operations, elements, components, groups thereof, or the like. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a memory system according to an embodiment. Referring to FIG. 1, a memory system 1000 may include a NAND flash memory 1100, a phase change memory 1200, and a controller 1300.

The NAND flash memory 1100 may include NAND flash memory cells. The NAND flash memory 1100 may be configured to exchange a command CMD, a control signal CTRL, an address ADDR, and data with the controller 1300. The NAND flash memory 1100 may be configured to perform programming, reading, and/or other operations in response to the controller 1300. The NAND flash memory 1100 may be a planar or vertical NAND flash memory. The NAND flash memory 1100 may be configured such that one NAND flash memory cell stores one or more bits of data.

The phase change memory 1200 may include phase change memory cells. The phase change memory 1200 may be configured to exchange a command CMD, a control signal CTRL, an address ADDR, and data with the controller 1300. The phase change memory 1200 may be configured to perform programming, reading, and/or other operations in response to the controller 1300. The phase change memory 1200 may be a planar or vertical phase change memory. The phase change memory 1200 may be configured such that one phase change memory cell stores one or more bits of data.

The phase change memory 1200 may be a phase change RAM (PRAM) including memory cells each having a crystal state, an amorphous state or a magnetic RAM (MRAM) including memory cells having a parallel state or an antiparallel state, or the like.

The controller 1300 may be configured to control the NAND flash memory 1100 and the phase change memory 1200. The controller 1300 may be configured to exchange a command CMD, a control signal CTRL, an address ADDR, and data with the NAND flash memory 1100 and the phase change memory 1200. The controller 1300 may include a NAND interface 1310. The controller 1300 may be configured to control not only the NAND flash memory 1100 but also the phase change memory 1200 via the NAND interface 1310.

The controller 1300 may be configured to program the NAND flash memory 1100 according to a command sequence which is based on the NAND interface 1310. Also, the controller 1300 may be configured to program the phase change memory 1200 according to a command sequence which is based on the NAND interface 1310. The controller 1300 may be configured to read the NAND flash memory 1100 according to a read sequence which is based on the NAND interface 1310. Also, the controller 1300 may be configured to read the phase change memory 1200 according to a read sequence which is based on the NAND interface 1310.

That is, the controller 1300 may read and program the NAND flash memory 1100 and the phase change memory 1200 using substantially the same NAND interface 1310. Since no separate interface is required to read and program the phase change memory 1200, the controller 1300 may have a reduced complexity, thus reducing a size of the controller 1300.

FIG. 2 is a table illustrating signals exchanged between a controller and different types of memories according to an embodiment. Referring to FIGS. 1 and 2, a controller 1300 may be configured to exchange data input/output signals DQ, a command latch enable signal CLE, an address latch enable signal ALE, a chip enable signal nCE, a read enable signal nRE, a write enable signal nWE, and a data strobe signal DQS with a NAND flash memory 1100 and a phase change memory 1200.

The controller 1300 may be configured to exchange the data input/output signals DQ with the NAND flash memory 1100 and the phase change memory 1200 via data pins. In example embodiments, a data pin standard may be defined to be x8, x16, x32, or the like. The NAND flash memory 1100 and the phase change memory 120 may be configured to exchange the data input/output signals DQ with the controller 1300 via data pins having the same standard.

The controller 1300 may be configured to send the command latch enable signal CLE to the NAND flash memory 1100 and the phase change memory 1200. The controller 1300 may be configured to send the command latch enable signal CLE to the NAND flash memory 1100 and the phase change memory 1200 via a separately assigned control pin. The command latch enable signal CLE may be a signal indicating that information transferred via the data input/output signals DQ is a command.

The controller 1300 may be configured to send the address latch enable signal ALE to the NAND flash memory 1100 and the phase change memory 1200. The controller 1300 may be configured to send the address latch enable signal ALE to the NAND flash memory 1100 and the phase change memory 1200 via a separately assigned control pin. The address latch enable signal ALE may be a signal indicating that information transferred via the data input/output signals DQ is an address.

The controller 1300 may be configured to send the chip enable signal nCE to the NAND flash memory 1100 and the phase change memory 1200. The controller 1300 may be configured to send the chip enable signal nCE to the NAND flash memory 1100 and the phase change memory 1200 via a separately assigned control pin. The chip enable signal nCE may indicate a memory chip selected from among the NAND flash memory 1100 and the phase change memory 1200.

The controller 1300 may be configured to send the read enable signal nRE to the NAND flash memory 1100 and the phase change memory 1200. The controller 1300 may be configured to send the read enable signal nRE to the NAND flash memory 1100 and the phase change memory 1200 via a separately assigned control pin. The read enable signal nRE may be provided to the selected NAND flash memory 1100 or phase change memory 1200 during a read operation. In a read operation, the read enable signal nRE may be used for clocking. The NAND flash memory 1100 and the phase change memory 1200 may be configured to send read data to the controller 1300 as a data output signal when selected, based on the read enable signal nRE clocking.

The controller 1300 may be configured to send the write enable signal nWE to the NAND flash memory 1100 and the phase change memory 1200. The controller 1300 may be configured to send the write enable signal nWE to the NAND flash memory 1100 and the phase change memory 1200 via a separately assigned control pin. The write enable signal nWE may be provided to the selected NAND flash memory 1100 or the phase change memory 1200 during a transfer of a command CMD or an address ADDR. When the write enable signal nWE is activated, the selected NAND flash memory 1100 or phase change memory 1200 may store data input signals provided from the controller 1300 as a command CMD or an address ADDR.

The controller 1300 may be configured to exchange the data strobe signal DQS with the NAND flash memory 1100 and the phase change memory 1200. The controller 1300 may be configured to exchange the data strobe signal DQS with the NAND flash memory 1100 and the phase change memory 1200 via a separately assigned control pin. During a program operation, the controller 1300 may be configured to send a transitioning/toggling data strobe signal to the selected NAND flash memory 1100 or the phase change memory 1200. During a read operation, the NAND flash memory 1100 and the phase change memory 1200 may be configured to send a transitioning/toggling data strobe signal to the controller 1300.

Although particular signals and connections have been described above for communication between the controller 1300 and the memories 1100 and 1200, in other embodiments, other signals and connections may be used.

Figure 3:
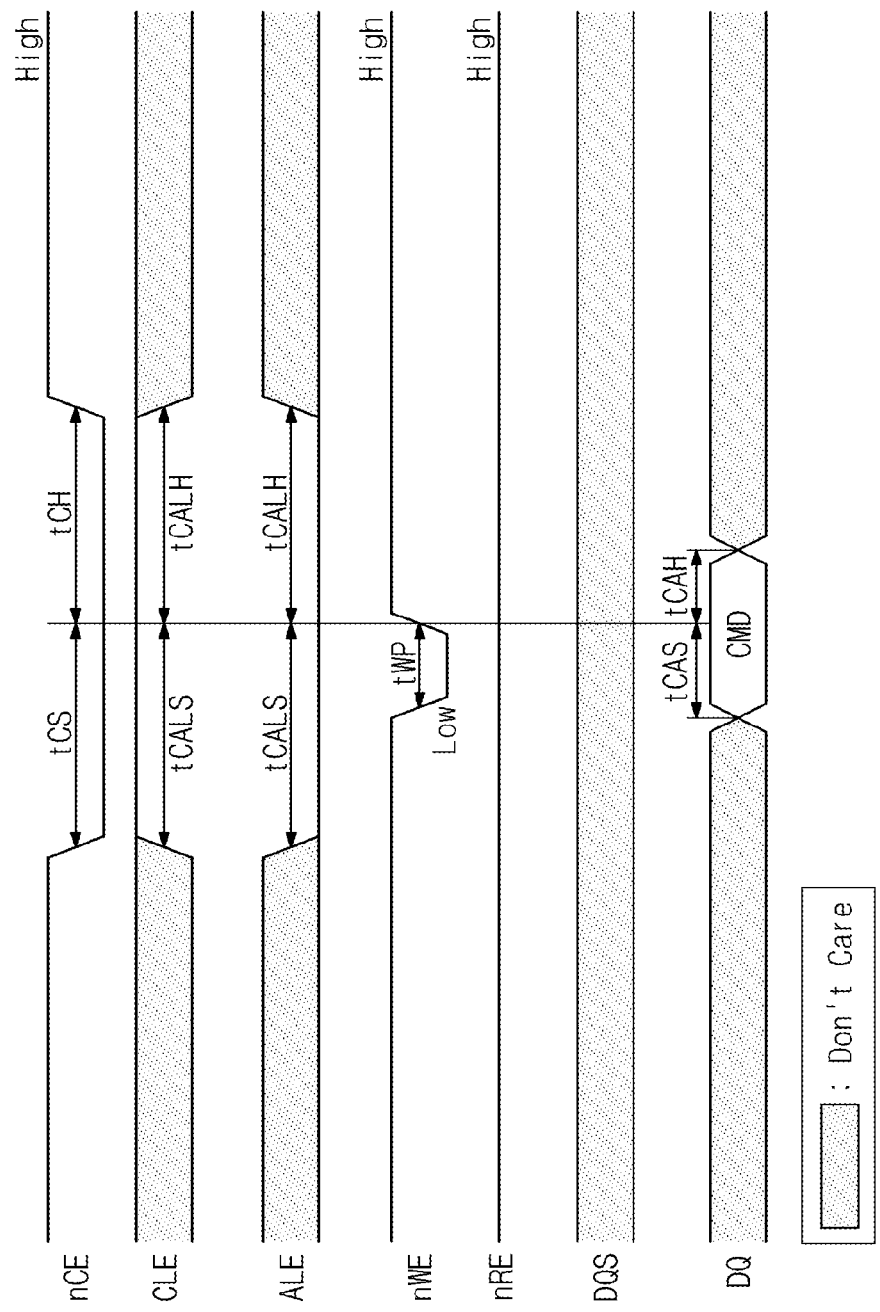
FIG. 3 is a timing diagram illustrating a sequence in which a controller transfers a command to different types of memories according to an embodiment.

FIG. 3 is a timing diagram illustrating a sequence in which a controller transfers a command to different types of memories according to an embodiment. Referring to FIGS. 1 to 3, a chip enable signal nCE to select a memory (such as the NAND flash memory 1100 or phase change memory 1200) may be activated (e.g., to a logically low state), a command latch enable signal CLE may be activated (e.g., to a logically high state), and an address latch enable signal ALE may be deactivated (e.g., to a logically low state).

A write enable signal nWE may transition to a low state and then go to a high state. When the write enable signal nWE transitions to a high state, the selected memory (such as the NAND flash memory 1100 or phase change memory 1200) may store a data input/output signal DQ as a command CMD. A data strobe signal DQS may be ignored.

A parameter tCS may indicate a setup time of the chip enable signal nCE, and may be synchronized in connection with a point in time when the write enable signal nWE transitions to a high state. A parameter tCH may indicate a hold time of the chip enable signal nCE, and may be synchronized in connection with a point in time when the write enable signal nWE transitions to a high state.

A parameter tCALS may indicate a setup time of a command latch enable signal CLE or an address latch enable signal ALE, and may be synchronized in connection with a point in time when the write enable signal nWE transitions to a high state. A parameter tCALH may indicate a hold time of the command latch enable signal CLE or the address latch enable signal ALE, and may be synchronized in connection with a point in time when the write enable signal nWE transitions to a high state.

A parameter tWP may indicate a low pulse width of the write enable signal nWE.

A parameter tCAS may indicate a setup time of a command or an address transferred as a data input/output signal DQ, and may be synchronized in connection with a point in time when the write enable signal nWE transitions to a high state. A parameter tCAH may indicate a hold time of a command or an address, and may be synchronized in connection with a point in time when the write enable signal nWE transitions to a high state.

Figure 4:
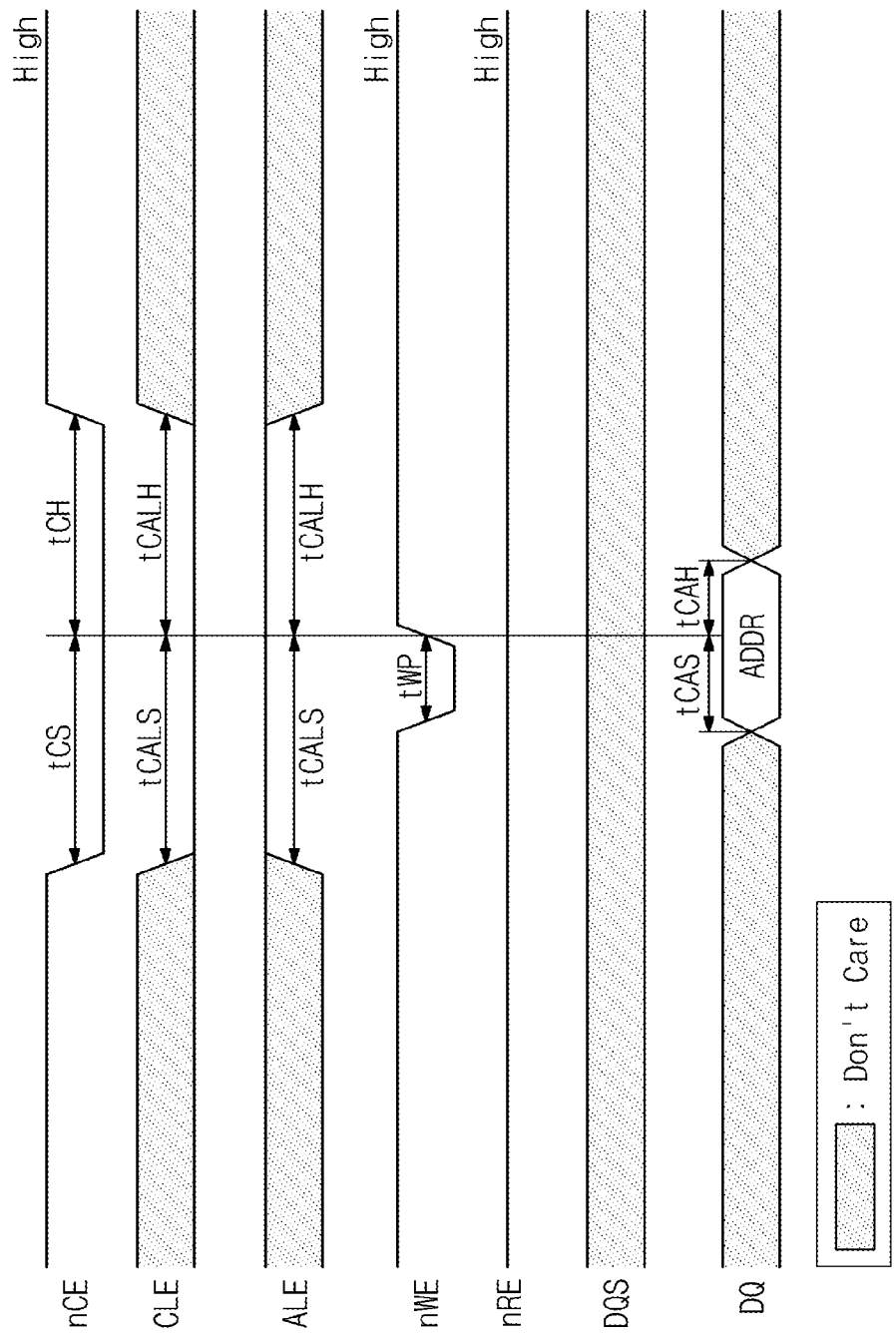
FIG. 4 is a timing diagram illustrating a sequence in which a controller transfers an address to different types of memories according to an embodiment.

FIG. 4 is a timing diagram illustrating a sequence in which a controller transfers an address to different types of memories according to an embodiment. Referring to FIGS. 1, 2, and 4, a chip enable signal nCE to select a memory (such as the NAND flash memory 1100 or phase change memory 1200) may be activated (e.g., to a logically low state), a command latch enable signal CLE may be deactivated (e.g., to a logically low state), and an address latch enable signal ALE may be activated (e.g., to a logically high state).

An address transfer sequence in FIG. 4 may be similar to a command transfer sequence in FIG. 3 except that a data input/output signal DQ is stored as an address ADDR, and description thereof is thus omitted.

Figure 5:
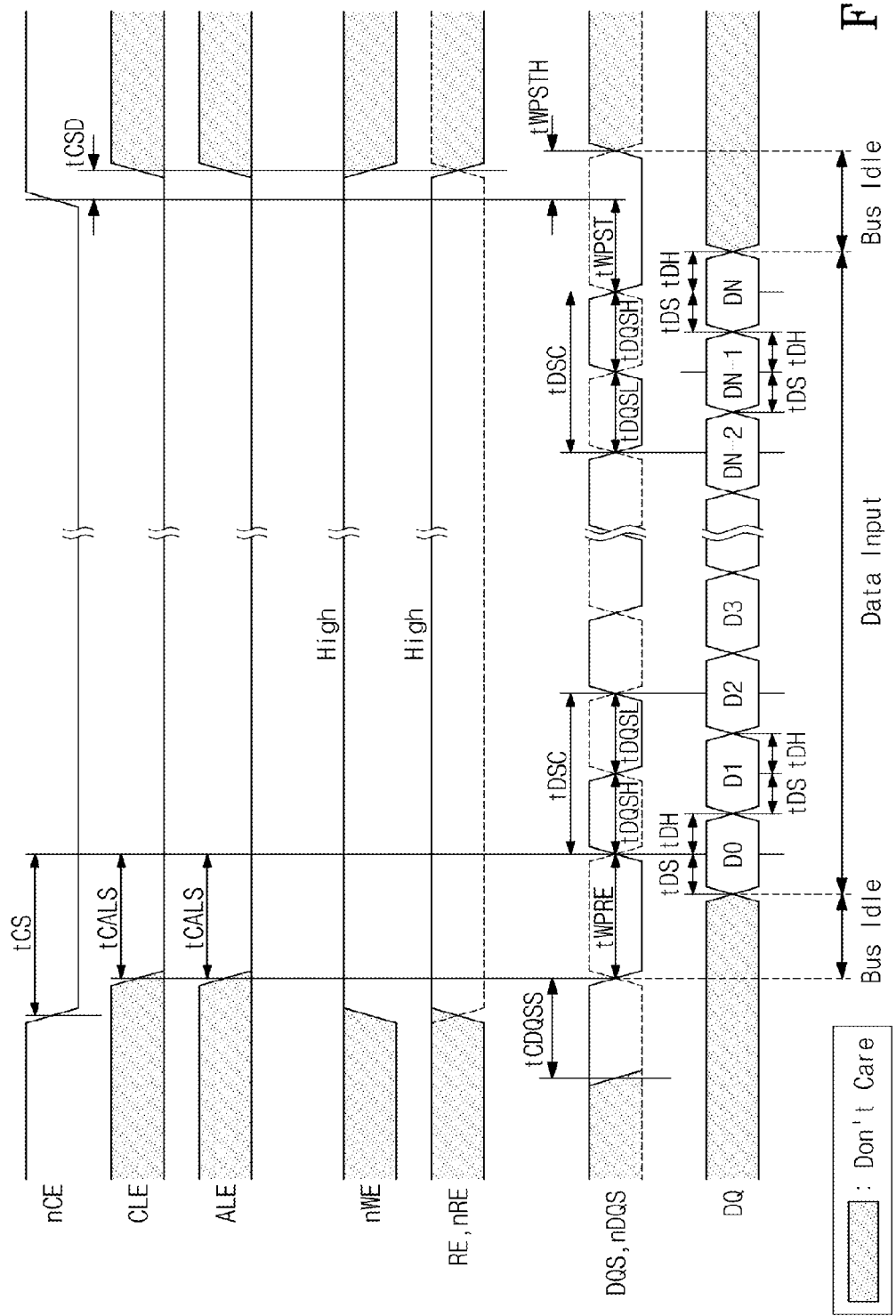
FIG. 5 is a timing diagram illustrating a sequence in which a controller programs data to different types of memories according to an embodiment.

FIG. 5 is a timing diagram illustrating a sequence in which a controller programs data to different types of memories according to an embodiment. Referring to FIGS. 1, 2, and 5, a chip enable signal nCE to select a memory (such as the NAND flash memory 1100 or phase change memory 1200) may be activated (e.g., to a logically low state), and a command latch enable signal CLE and an address latch enable signal ALE may be deactivated (e.g., to a logically low state). A read enable signal RE may be activated (e.g., to a logically high state). In this embodiment, the read enable signal is formed of a pair of differential signals RE and nRE. A write enable signal nWE may be deactivated (e.g., to a logically high state).

A data strobe signal DQS may transition to a low state in synchronization with the deactivation of the command latch enable signal CLE and the address latch enable signal ALE. The data strobe signal DQS may maintain a high state for a time corresponding to a parameter tCDQSS before the deactivation of the command latch enable signal CLE and the address latch enable signal ALE. The time may be a data strobe setup time. The data strobe signal DQS may maintain a low state during a time corresponding to a parameter tWPRE. The time may be a write preamble time. If the write preamble time elapses, the data strobe signal DQS may have low-to-high and high-to-low transitions iteratively and sequentially.

The data strobe signal DQS may be formed of a pair of differential signals DQS and nDQS. A parameter tDQSL may indicate a time when the data strobe signal DQS maintains a low state and nDQS maintains a high state, and a parameter tDQSH may indicate a time when the data strobe signal DQS maintains a high state and nDQS maintains a low state. A parameter tDSC may indicate a cycle time of the data strobe signals DQS and nDQS. That is, the parameter tDSC may indicate a time from a low-to-high transition of the data strobe signals DQS or nDQS until a subsequent low-to-high transition. A parameter tWPST may indicate a write postamble, and a parameter tWPSTH may indicate a write postamble hold time. A parameter tCSD may indicate a hold time after deactivating the chip enable signal nCE.

When data is transferred to a selected memory (such as the NAND flash memory 1100 or phase change memory 1200), the data strobe signal DQS may be generated by the controller 1300 and transferred to the selected memory (the NAND flash memory 1100 or the phase change memory 1200).

Data D0 to DN may be sequentially received as a data input/output signal DQ after the write preamble time tWPRE. Data (e.g., D0) received at a time may be parallel data received by a type of x8, x16, x32, or the like according to the standard of the data input/output signal DQ. A selected memory (such as the NAND flash memory 1100 or phase change memory 1200) may store the data input/output signal DQ as data in synchronization with a rising edge and a falling edge of the data strobe signal DQS. In example embodiments, a parameter tDS may indicate a data setup time, and a parameter tDH may indicate a data hold time relative to a transition of the data strobe signal DQS.

Figure 6:
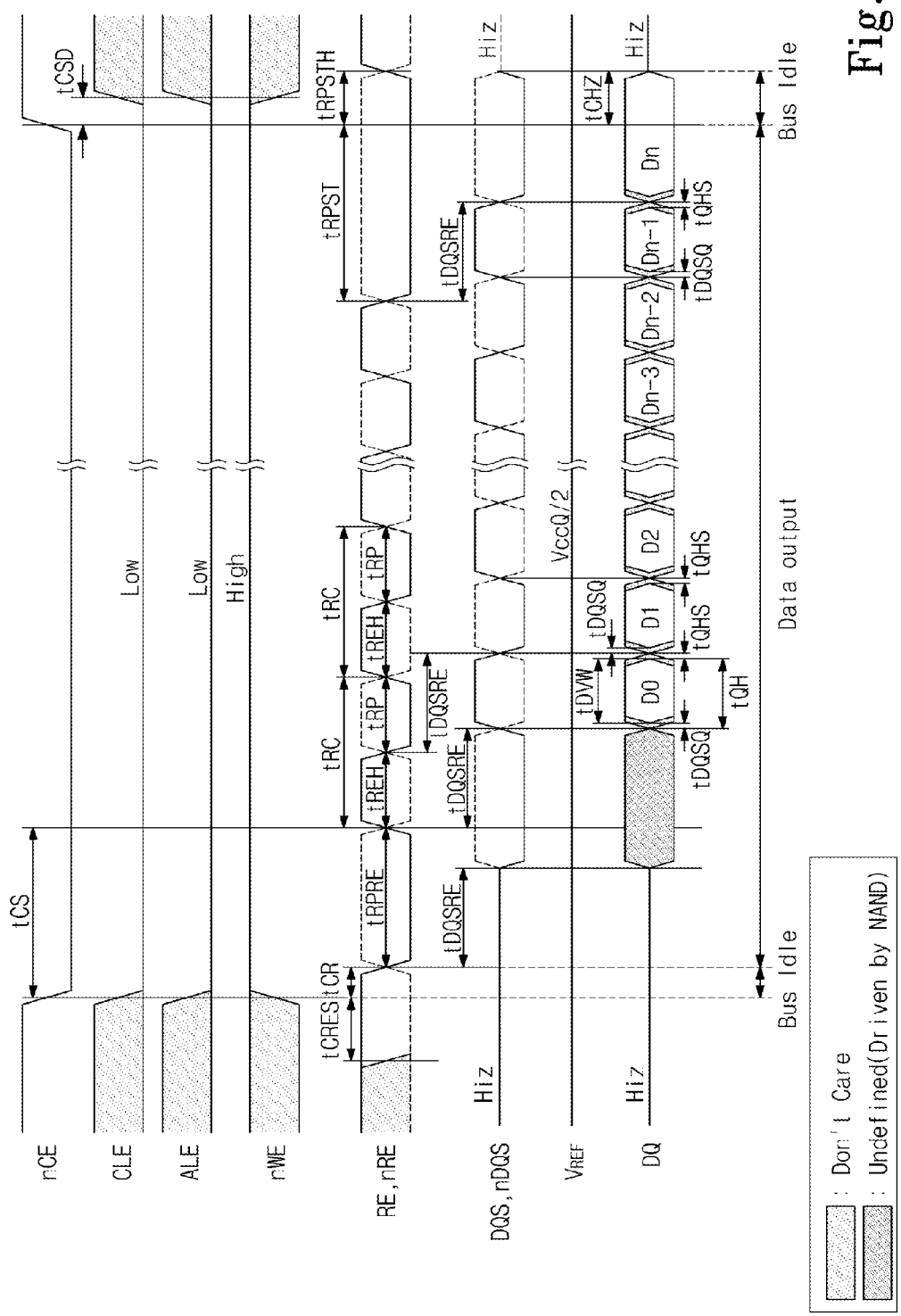
FIG. 6 is a timing diagram illustrating a sequence in which a controller reads data from different types of memories according to an embodiment.

FIG. 6 is a timing diagram illustrating a sequence in which a controller reads data from different types of memories according to an embodiment. Referring to FIGS. 1, 2, and 6, a chip enable signal nCE to select a memory (such as the NAND flash memory 1100 or phase change memory 1200) may be activated (e.g., to a logically low state), and a command latch enable signal CLE and an address latch enable signal ALE may be deactivated (e.g., to a logically low state). A write enable signal nWE may be deactivated (e.g., to a high state).

A read enable signal RE may maintain a low state during a time corresponding to a parameter tRPRE. This time may be a read preamble time. If the read preamble time elapses, the read enable signal RE may have high-to-low and low-to-high transitions iteratively and sequentially. A parameter tCRES and tCR may indicate a setup and hold time, respectively, of the leading high state of the read enable signal RE before transition to the low state of the read preamble time.

The read enable signal RE may be formed of a pair of differential signals RE and nRE. In example embodiments, a parameter tREH may indicate a high pulse width of the read enable signal RE and low pulse width of the read enable signal nRE. Similarly, a parameter tRP may indicate a low pulse width of the read enable signal RE and a high pulse width of the read enable signal nRE. A parameter tRPST may indicate a read postamble time, and a parameter tRPSTH may indicate a read postamble hold time.

The data strobe signal may be a formed of a pair of differential data strobe signals DQS and nDQS. The differential data strobe signal DQS and nDQS may transition to a differential low state during the read preamble time. The data strobe signals DQS and nDQS may transition to a differential low state when the read enable signals RE and nRE transitions to a differential low state and a time corresponding to a parameter tDQSRE elapses. The parameter tDQSRE may indicate a delay between the read enable signals RE and nRE and the data strobe signal DQS and nDQS.

When the read preamble time ends, the read enable signals RE and nRE have low-to-high and high-to-low differential transitions iteratively and sequentially. The data strobe signals DQS and nDQS may have substantially the same waveform as the read enable signals RE and nRE except that it is delayed by a parameter tDQSRE. In example embodiments, a selected memory (such as the NAND flash memory 1100 or phase change memory 1200) may generate the data strobe signals DQS and nDQS by delaying the read enable signal RE and nRE received from the controller 1300. The data strobe signals DQS and nDQS may be sent to the controller 1300.

The selected memory may output read data as a data input/output signal DQ in synchronization with the data strobe signals DQS and nDQS. The controller 1300 may store the data input/output signal DQ in synchronization with the data strobe signals DQS and nDQS.

A parameter tDQSQ may indicate a skew between the data input/output signal DQ and the data strobe signals DQS and nDQS. A parameter tQH may indicate an output hold time of the data strobe signal DQS or nDQS. That is, the parameter tQH may indicate a hold time of the data strobe signal DQS and nDQS transferred to the controller 1300 from the selected memory.

A parameter tQHS may indicate a hold skew factor of the data strobe signal DQS or nDQ.

A parameter tDVW may indicate a valid window of data output as a data input/output signal DQ.

A parameter tCHZ may indicate a time from a time when the chip enable signal nCE is deactivated to a high state until the data input/output signal DQ is set to high-impedance.

In FIGS. 5 and 6, data may be transferred in synchronization with rising and falling edges of data strobe signals DQS and nDQS. However, data may be transferred in synchronization with one of the rising and falling edges of the data strobe signal DQS and nDQS. Alternatively, data can be transferred in synchronization with a signal different from the data strobe signal DQS or nDQS. Moreover, although particular timings, logic states, synchronization, or the like have been described, in other embodiments, other timing, logic states, synchronization, or the like may be used.

Figure 7:
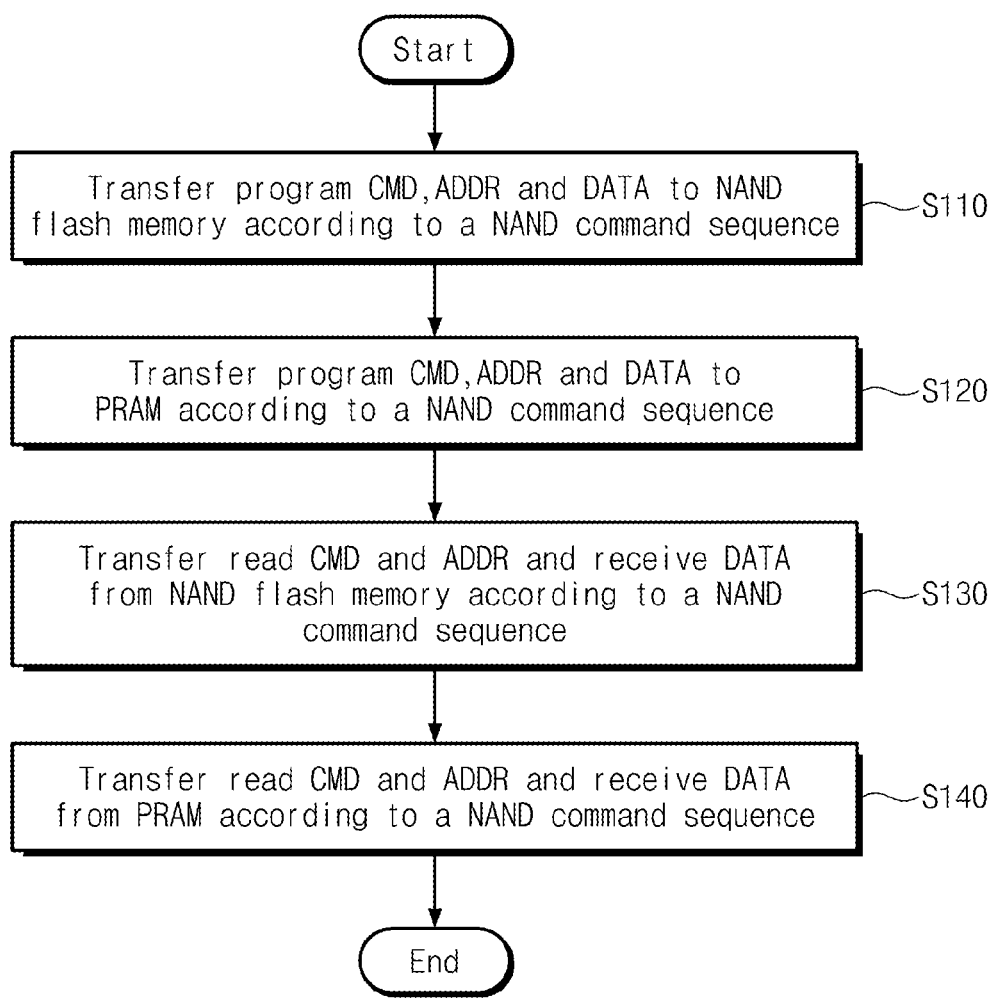
FIG. 7 is a flowchart illustrating a method of operating a controller according to an embodiment.

FIG. 7 is a flowchart illustrating an operating method of a controller according to an embodiment. Referring to FIGS. 1 and 7, in operation S110, a controller 1300 may be configured to provide a NAND flash memory 1100 with a program command CMD, an address ADDR, and data according to a NAND command sequence. In operation S120, the controller 1300 may be configured to provide a phase change memory 1200 with a program command CMD, an address ADDR, and data according to the NAND command sequence. With the NAND command sequence, the program command CMD may be sent as described with reference to FIG. 3, the address ADDR may be transferred as described with reference to FIG. 4, and data may be transferred as described with reference to FIG. 5. The phase change memory 1200 may be configured to receive a program command CMD, an address ADDR, and data according to a substantially similar command sequence as the NAND flash memory 1100.

In operation S130, the controller 1300 may be configured to provide the NAND flash memory 1100 with a read command CMD and an address ADDR according to the NAND command sequence, and may be configured to receive read data from the NAND flash memory 1100. In operation S140, the controller 1300 may be configured to provide the phase change memory 1200 with a read command CMD and an address ADDR according to the NAND command sequence, and may be configured to receive read data from the phase change memory 1200. With the NAND command sequence, the read command CMD may be sent as described with reference to FIG. 3, the address ADDR may be transferred as described with reference to FIG. 4, and read data may be transferred as described with reference to FIG. 6. The phase change memory 1200 may be configured to receive a read command CMD, an address ADDR, and transmit data according to substantially similar command sequence as the NAND flash memory 1100.

Although a particular sequence of operations has been described above, the operations can be performed in different orders and independently. For example, operations S110, S120, S130, and S140 may be performed independently or in any order. Moreover, operations S110, S120, S130, and S140 are examples of communications between a controller 1300 and the NAND flash memory 1100 and the phase change memory 1200. Other types of communications can be performed according to a NAND command sequence.

Figure 8:
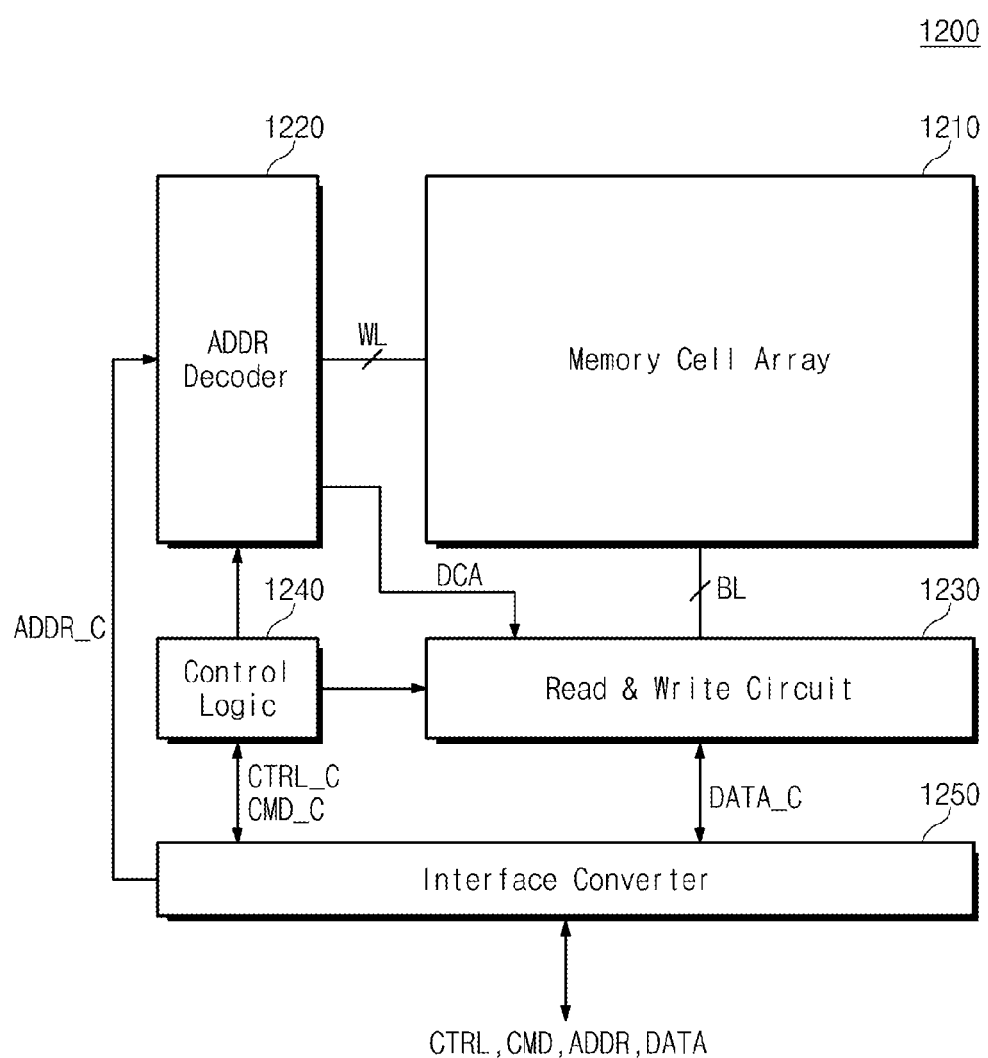
FIG. 8 is a block diagram schematically illustrating a memory device according to an embodiment.

FIG. 8 is a block diagram schematically illustrating a memory device according to an embodiment. Referring to FIG. 8, in this embodiment, the memory device is a phase change memory 1200. The phase change memory 1200 may include a memory cell array 1210, an address decoder 1220, a read/write circuit 1230, control logic 1240, and an interface converter 1250.

The memory cell array 1210 may include a plurality of phase change memory cells. Phase change memory cells arranged in a row direction may be connected with word lines, and phase change memory cells arranged in a column direction may be connected with bit lines. The phase change memory cells may be programmed by a set current (or, voltage) and erased by a reset current (or, voltage). The phase change memory cells may be over-writable. The phase change memory cells may store two or more bits of data, respectively.

The address decoder 1220 may be connected to the memory cell array 1210 via word lines WL, and may receive a converted address ADDR_C from the interface converter 1250. The address decoder 1220 may be configured to decode a row address of the converted address ADDR_C, and may be configured to select the word lines to the decoded row address. The address decoder 1220 may be configured to decode a column address DCA of the converted address ADDR_C to transfer it to the read/write circuit 1230.

The read/write circuit 1230 may be connected to the memory cell array 1210 via the bit lines BL. The read/write circuit 1230 may be configured to select the bit lines BL in response to the decoded column address DCA from the address decoder 1220.

The read/write circuit 1230 may be configured to write converted data DATA_C from the interface converter 1250 to the memory cell array 1210. The read/write circuit 1230 may be configured to read converted data DATA_C stored in the memory cell array 1210 to output it to the interface converter 1250.

The control logic 1240 may be configured to control the address decoder 1220 and the read/write circuit 1230. The control logic 1240 may be configured to operate responsive to a converted control signal CTRL_C and a converted command CMD_C from the interface converter 1250.

The interface converter 1250 may be configured to communicate with an external device according to an interface of a NAND flash memory. The interface converter 1250 may be configured to receive a control signal CTRL, a command CMD, an address ADDR, and data from an external device. The interface converter 1250 may output a control signal CTRL and data to the external device according to an interface of a NAND flash memory.

The interface converter 1250 may be configured to convert an input control signal CTRL to output it to the control logic 1240. The converted control signal CTRL_C may be a control signal complying with an internal interface of the phase change memory 1200.

The converted control signal CTRL_C may be equal to the control signal CTRL or different from the control signal CTRL. Alternatively, a part of the converted control signal CTRL_C may be equal to the control signal CTRL. In the latter case, a part of the converted control signal CTRL_C may be different from the control signal CTRL. The interface converter 1250 may be configured to output a control signal CTRL to an external device in response to the control of the control logic 1240. The control signal may be output according to an interface of a NAND flash memory.

The interface converter 1250 may be configured to convert a command CMD received from an external device to transfer it to the control logic 1240. The converted command CMD_C may comply with an interface of the phase change memory 1200. The converted command CMD_C may be equal to the command CMD or different from the command CMD. Alternatively, a part of the converted command CMD_C may be equal to the command CMD. In the latter case, a part of the converted command CMD_C may be different from the command CMD.

The interface converter 1250 may be configured to convert an address ADDR received from an external device to transfer it to the address decoder 1220. The converted address ADDR_C may comply with an interface of the phase change memory 1200. The converted address ADDR_C may be equal to the address ADDR or different from the address ADDR. Alternatively, a part of the converted address ADDR_C may be equal to the address ADDR. In the latter case, a part of the converted address ADDR_C may be different from the address ADDR.

The interface converter 1250 may be configured to convert data received from an external device to transfer it to the read/write circuit 1230. The converted data DATA_C may comply with an interface of the phase change memory 1200. The converted data DATA_C may be equal to the data provided from an external device or different from the data provided from an external device. Alternatively, a part of the converted data DATA_C may be equal to the data provided from an external device. In the latter case, a part of the converted data DATA_C may be different from the data provided from an external device.

Although a phase change memory 1200 has been used as an example of a memory device, other types of memory devices can include interface converters similar to interface converter 1250 described above. These interface converters can be appropriately configured to generate converted data and control signals appropriate for the type of memory device from a particular format, such as a format of an interface of a NAND flash memory. That is, the interface converter 1250 can be configured to convert to and from command sequences according to an interface format.

Figure 9:
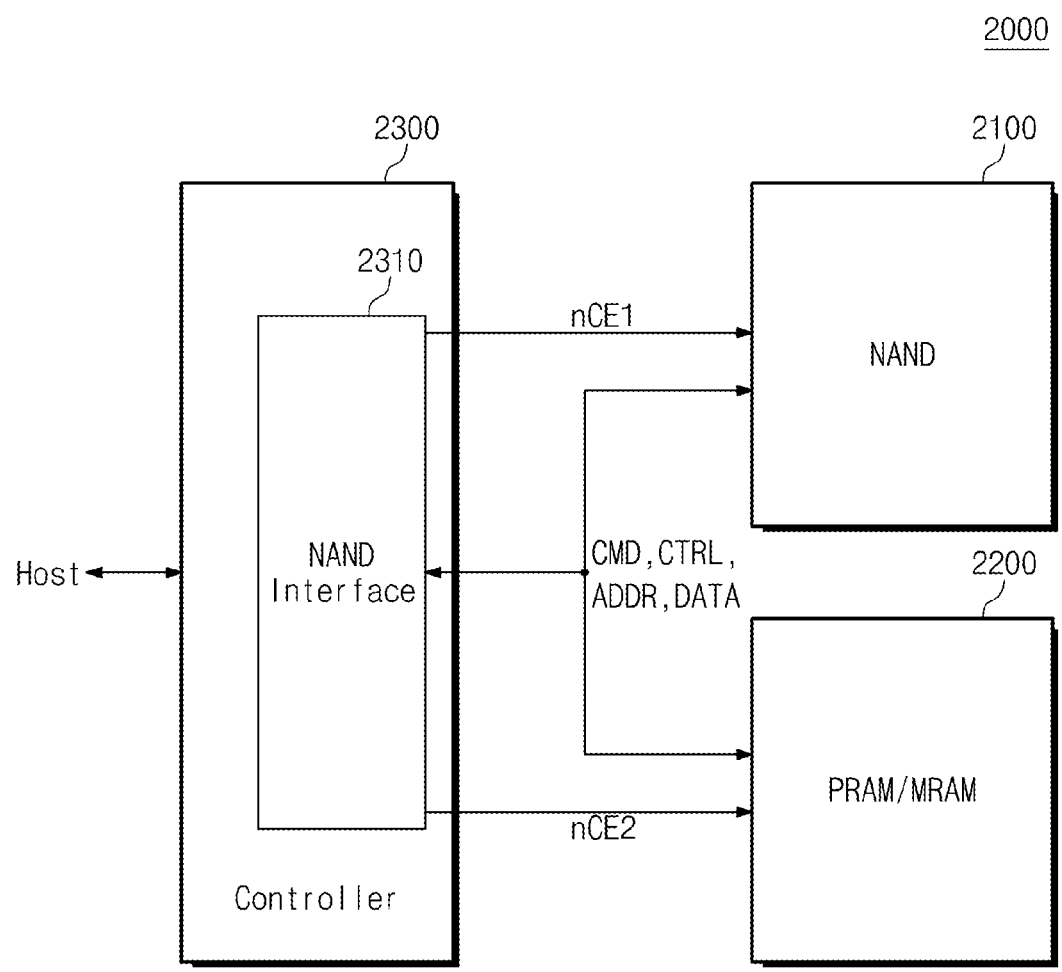
FIG. 9 is a block diagram schematically illustrating a memory device according to another embodiment.

FIG. 9 is a block diagram schematically illustrating a memory system according to another embodiment. A controller 2300 may be configured to control a NAND flash memory 2100 and a phase change memory 2200 via a common bus. The NAND flash memory 2100 and the phase change memory 2200 may be configured to communicate with the controller 2300 in a time division manner.

In an embodiment, the controller 2300 may be configured to provide the NAND flash memory 2100 and the phase change memory 2200 with independent chip enable signals nCE1 and nCE2, respectively. The controller 2300 may be configured to select the NAND flash memory 2100 and the phase change memory 2200 independently by transferring the chip enable signals nCE1 and nCE2 via separate buses.

Figure 10:
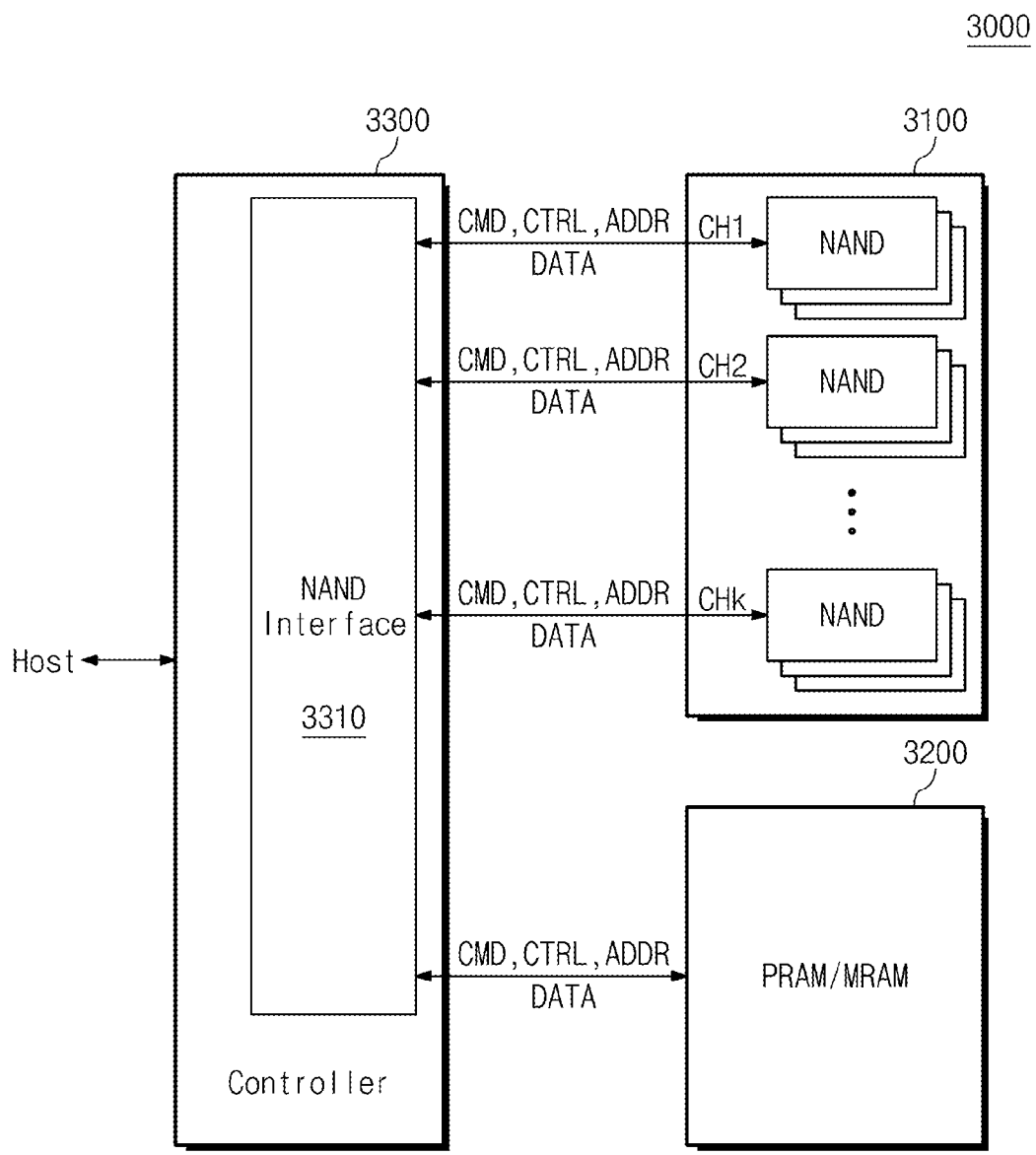
FIG. 10 is a block diagram schematically illustrating a memory system according to still another embodiment.

FIG. 10 is a block diagram schematically illustrating a memory system according to still another embodiment. A NAND flash memory 3100 may communicate with a controller 3300 via a plurality of channels CH1 to CHk. Each channel may be connected with a plurality of NAND flash memory chips.

In another embodiment, similar to FIG. 9, the NAND flash memory 3100 and the controller 3300 may be connected via a common bus, and the plurality of channels CH1 to CHk may be configured to communicate over the common bus in a time division manner.

In another embodiment, similar to FIG. 9, the NAND flash memory 3100 and the phase change memory 3200 may be connected with the controller 3300 via a common bus, and may be configured to communicate with the controller 3300 in a time division manner.

Figure 11:
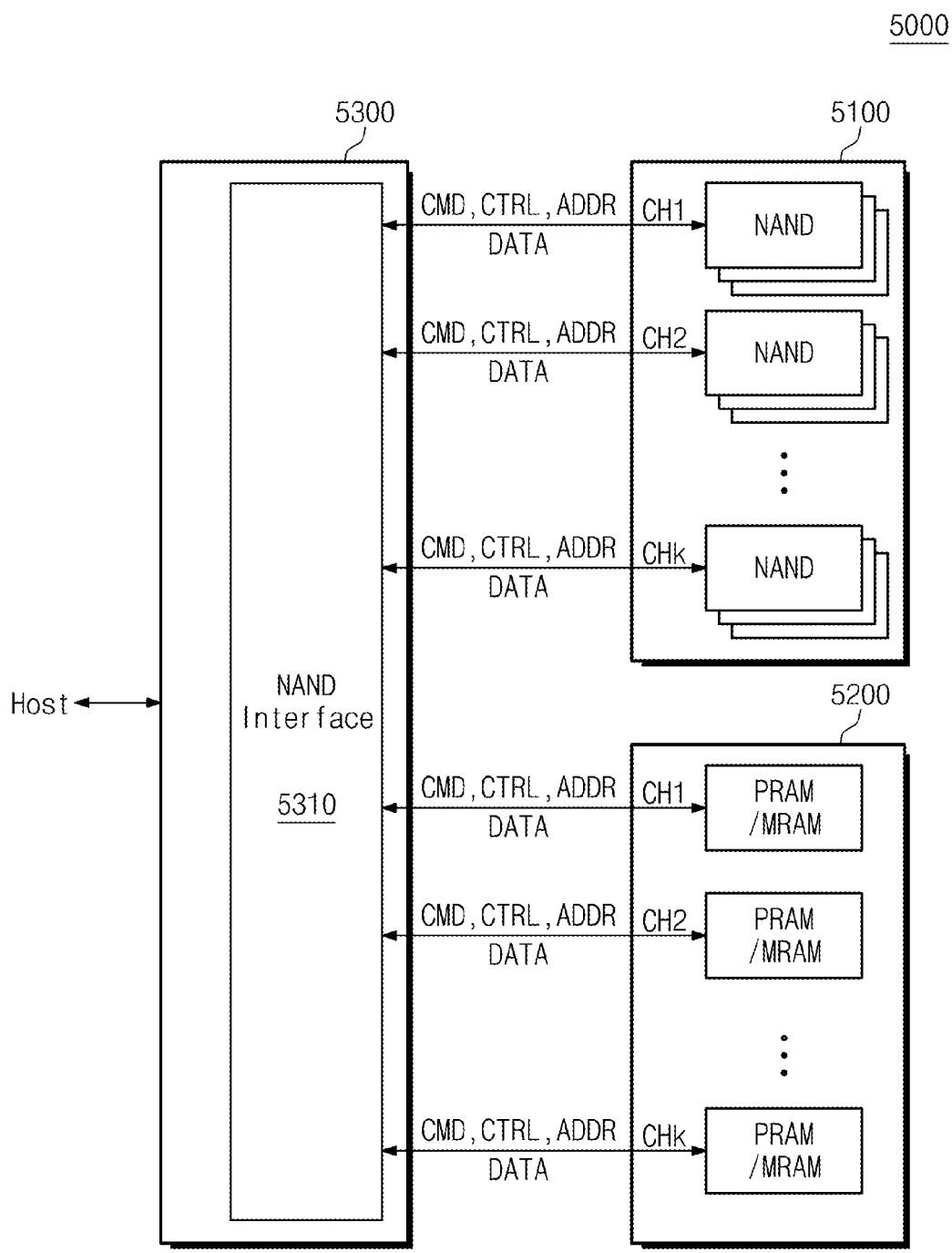
FIG. 11 is a block diagram schematically illustrating a memory system according to still another embodiment.

FIG. 11 is a block diagram schematically illustrating a memory system according to still another embodiment. A NAND flash memory 5100 may be configured to communicate with a controller 5300 via a plurality of channels CH1 to CHk. Each channel may be connected with a plurality of NAND flash memory chips. A phase change memory 5200 may communicate with the controller 5300 via a plurality of channels CH1 to CHk. A phase change memory connected with each channel may correspond to a plurality of NAND flash memory chips connected with a channel.

In another embodiment, similar to FIG. 9, the NAND flash memory 5100 and the controller 5300 may be connected via a common bus, and the plurality of channels CH1 to CHk may be configured to communicate over the common bus in a time division manner.

In another embodiment, similar to FIG. 9, the phase change memory 5200 and the controller 5300 may be connected via a common bus, and the plurality of channels CH1 to CHk may be configured to communicate over the common bus in a time division manner.

In another embodiment, similar to FIG. 9, the NAND flash memory 5100 and the phase change memory 5200 may be connected with the controller 5300 via a common bus, and may be configured to communicate with the controller 3300 in a time division manner.

Although each of the NAND flash memory 5100 and phase change memory 5200 have been described as having k channels, the NAND flash memory 5100 and phase change memory 5200 can, but need not have the same number of channels.

Figure 12:
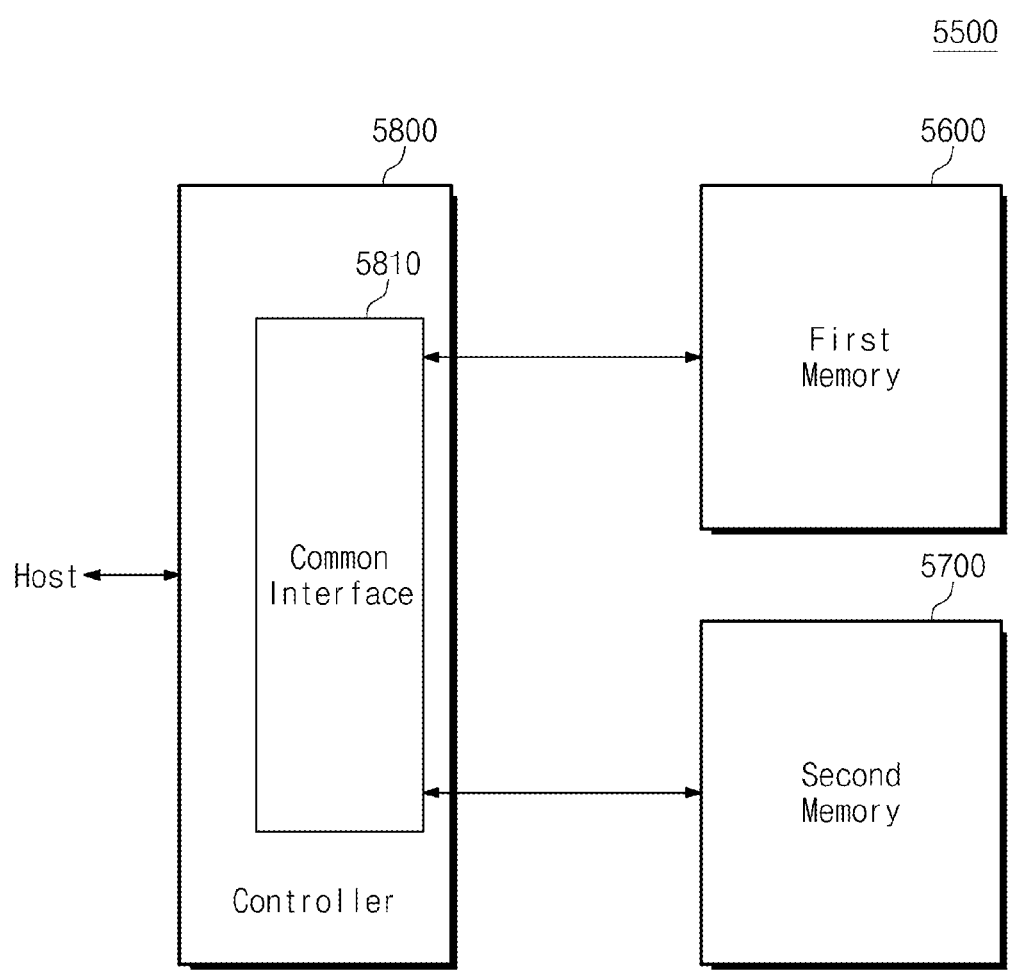
FIG. 12 is a block diagram schematically illustrating a memory system according to still another embodiment.

FIG. 12 is a block diagram schematically illustrating a memory system according to still another embodiment. In this embodiment, the memory system 5500 includes a first memory 5600, a second memory 5700, and a controller 5800. The first memory 5600 and second memory 5700 are different types of memories according to an embodiment.

Similar to FIG. 1, the first memory 5600 and the second memory 5700 are configured to communicate with the controller 5800 using a common interface 5810. The common interface may be any type of memory interface, and may be the same type as the first memory 5600 or have a type different from the types of memories 5600 and 5700. For example, the common interface 5810 may be configured to communicate according to a DRAM interface. The first memory 5600 may be a NAND flash memory. The second memory 5700 may be an FRAM. Accordingly, each of the memories 5600 and 5700 may include interface converters as described above configured to convert from the DRAM interface to the corresponding internal interface.

In an embodiment, similar to FIG. 9, busses that coupled the memories 5600 and 5800 may be independent or include common signals, lines, or the like. In another embodiment, each of the memories 5600 and 5700 can include multiple channels as described above.

Although only two memories 5600 and 5700 have been illustrated, any number of memories of any variety of types can be coupled to the controller 5800. Each memory can be configured to communicate with the controller 5800 using the common interface 5810 regardless of whether the common interface 5810 is the same type as the memory or the memory has in interface converter.

Figure 13:
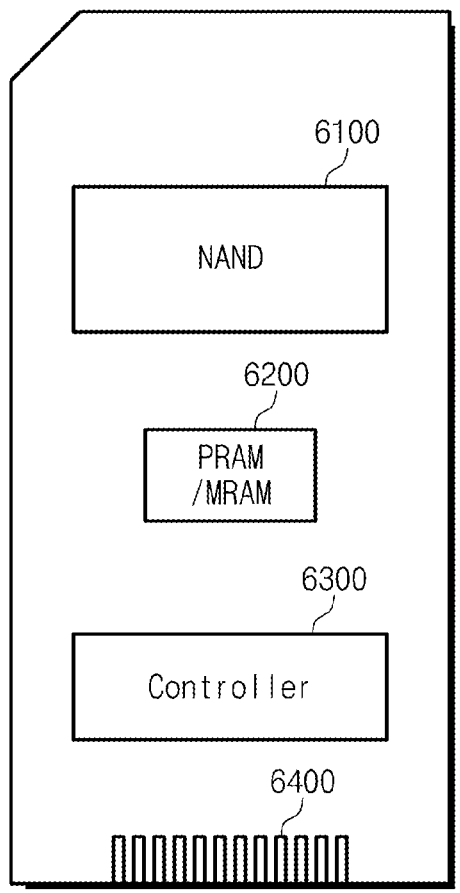
FIG. 13 is a diagram illustrating a memory card according to an embodiment.

FIG. 13 is a diagram illustrating a memory card according to an embodiment. Referring to FIG. 13, a memory card 6000 may include a NAND flash memory 6100, a phase change memory 6200, a controller 6300, and a connector 6400.

The controller 6300 may be configured to control the NAND flash memory 6100 and the phase change memory 6200 according to the same NAND command sequence. The connector 6400 may be configured to connect the memory card 6000 with a host electrically.

The memory card 6000 may have the form of memory cards such as a PC (PCMCIA) card, a CF card, an SM (or, SMC) card, a memory stick, a multimedia card (MMC, RS-MMC, MMCmicro), a security card (SD, miniSD, microSD, SDHC), a universal flash storage (UFS) device, or the like.

Figure 14:
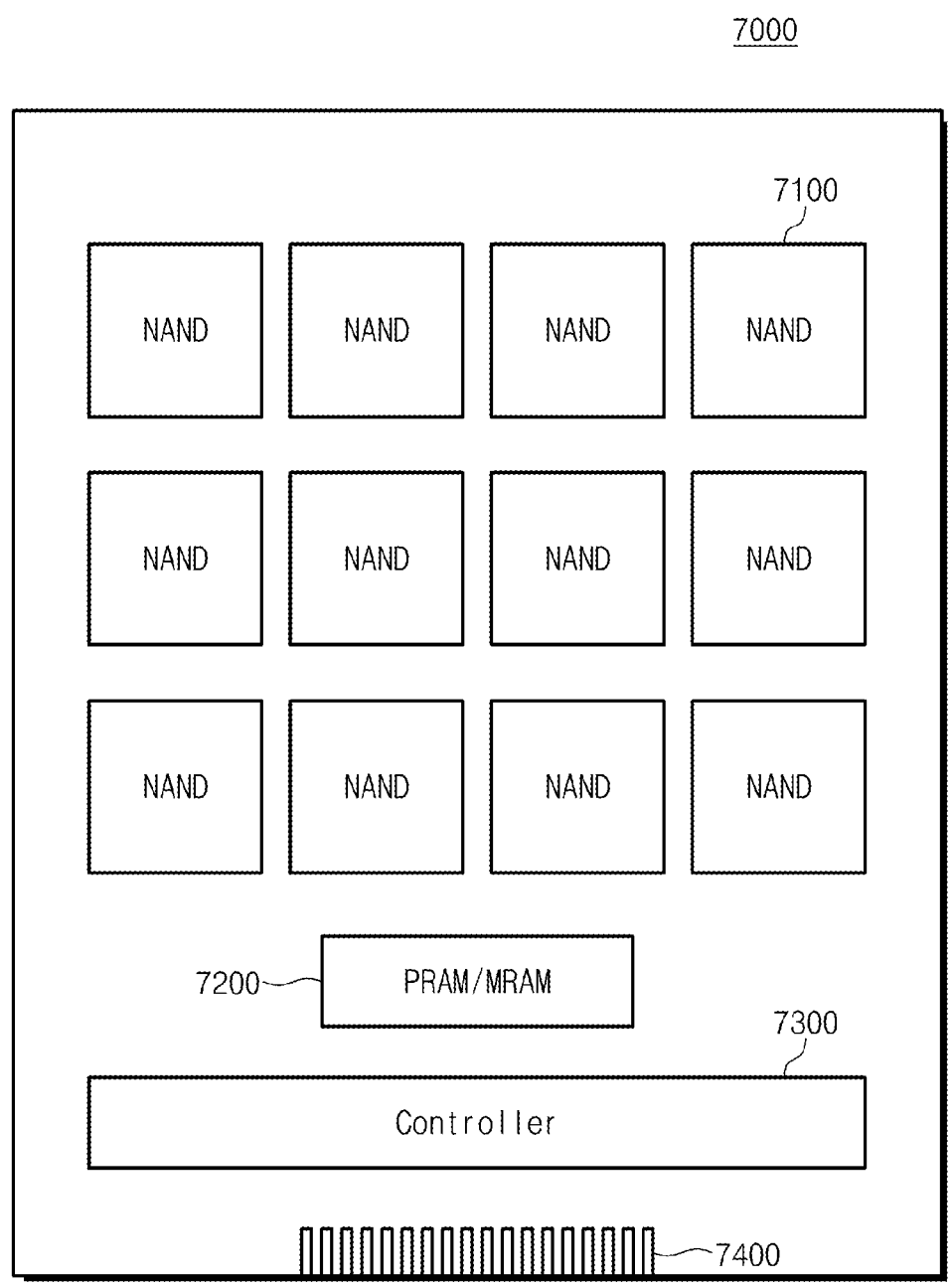
FIG. 14 is a diagram illustrating a solid state drive according to an embodiment.

FIG. 14 is a diagram illustrating a solid state drive according to an embodiment. Referring to FIG. 14, a solid state drive 7000 may include a plurality of NAND flash memory 7100, a phase change memory 7200, a controller 7300, and a connector 7400.

The controller 7400 may be configured to control the NAND flash memory 7100 and the phase change memory 7200 according to the same NAND command sequence. The connector 7400 may be configured to connect the solid state driver 7000 with a host electrically.

Figure 15:
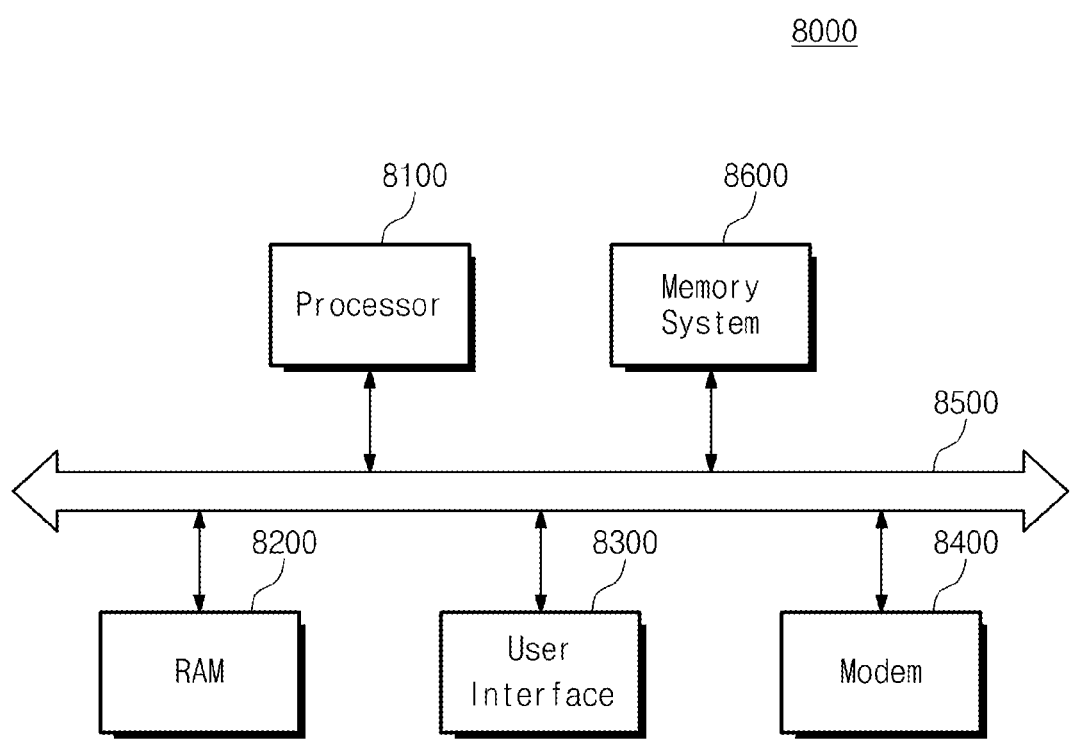
FIG. 15 is a block diagram illustrating a computing system according to an embodiment.

FIG. 15 is a block diagram illustrating a computing system according to an embodiment. Referring to FIG. 15, a computing system 8000 may include a central processing unit 8100, a RAM 8200, a user interface 8300, a modem 8400, a system bus 8500, and a memory system 8600.

The memory system 8600 may be connected electrically with the elements 8100 to 8400 via the system bus 8500. Data provided via the user interface 8300 or processed by the central processing unit 8100 may be stored in the memory system 8600.

The memory system 8600 may be any of memory systems described above.

An embodiment includes a memory system which comprises a NAND flash memory; a variable resistance memory; and a controller configured to control the NAND flash memory and the variable resistance memory, wherein the controller controls a program operation of the NAND flash memory and a program operation of the variable resistance memory according to the same command sequence.

In other embodiments, each of the NAND flash memory and the variable resistance memory is configured to exchange a plurality of data input/output signals, a chip enable signal, and a data strobe signal with the controller.

In other embodiments, the controller activates a chip enable signal transferred to one selected from the NAND flash memory and the variable resistance memory.

In other embodiments, the controller provides one selected from the NAND flash memory and the variable resistance memory with a clocking data strobe signal and a plurality of data input/output signals synchronized with the clocking data strobe signal.

In other embodiments, the controller controls a read operation of the NAND flash memory and a read operation of the variable resistance memory according to the same command sequence.

In other embodiments, each of the NAND flash memory and the variable resistance memory is configured to exchange a plurality of data input/output signals, a read enable signal, and a data strobe signal with the controller.

In other embodiments, one selected from the NAND flash memory and the variable resistance memory receives a clocking read enable signal from the controller, generates a clocking data strobe signal based on the clocking read enable signal, and transfers the clocking data strobe signal to the controller.

In other embodiments, the selected memory transfers a plurality of data output signals synchronized with the clocking data strobe signal to the controller.

In other embodiments, the data output signals are synchronized with rising and falling edges of the clocking data strobe signal.

In other embodiments, each of the NAND flash memory and the variable resistance memory is configured to exchange a plurality of data input/output signals, a command latch enable signal, an address latch enable signal, and a write enable signal with the controller.

In other embodiments, one selected from the NAND flash memory and the variable resistance memory stores a plurality of input signals transferred from the controller as a command when the command latch enable signal is at an active state and the write enable signal is at an active state.

In other embodiments, one selected from the NAND flash memory and the variable resistance memory stores a plurality of input signals transferred from the controller as an address when the address latch enable signal is at an active state and the write enable signal is at an active state.

In other embodiments, the NAND flash memory and the variable resistance memory communicate with the controller via a common bus.

Another embodiment includes an operating method of a controller which controls a NAND flash memory and a variable resistance memory, the operating method comprising programming the NAND flash memory according to a command sequence; and programming the variable resistance memory according to the command sequence.

In other embodiments, the operating method further comprises reading the NAND flash memory according to a read sequence; and reading the variable resistance memory according to the read sequence.

Embodiments have been described using memory systems each including a phase change memory and a NAND flash memory. However, the scope of the claims is not limited thereto. Other embodiments may include a memory system including one of a NAND flash memory and variable resistance memories such as MRAM, FeRAM, ReRAM, and the like. The resistance-variable memory may comply with a NAND sequence. In other embodiments, any type of memory and any type of memory interface can be used. In particular, the type of memory interface can, but need not be the same type as any of the memory devices.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A memory system, comprising:
a first memory, the first memory being a flash memory;
a second memory different from the flash memory; and
a controller configured to control the first memory and the second memory;
wherein:
the controller is configured to control the first memory through a first channel, the first channel being a flash channel;
the controller is configured to control the second memory through a second channel, the second channel being the flash channel; and
the flash channel includes a first line configured to transfer a command latch enable signal selecting a command input cycle, a second line configured to transfer an address latch enable signal selecting an address input cycle, and a plurality of input/output lines configured to transfer a command, an address, and data.

2. The memory system of claim 1, wherein:
the first memory is a NAND flash memory; and
the second memory is a variable resistance memory.

3. The memory system of claim 1, wherein:
the second memory includes an interface converter configured to convert received signals corresponding to the flash channel into internal signals corresponding to a random access channel.

4. The memory system of claim 1, further comprising:
a common bus coupled to the first memory, the second memory, and the controller;
wherein the controller is configured to control the first memory and second memory at least in part through the common bus.

5. The memory system of claim 4, wherein the controller is configured to communicate at least one of the command latch enable signal, the address latch enable signal, a write enable signal, a read enable signal, a data strobe signal, the command, the address and the data over the common bus with the first memory and the second memory.

6. The memory system of claim 4, wherein the controller is configured to communicate each of the command latch enable signal, the address latch enable signal, a write enable signal, a read enable signal, a data strobe signal, and the command, the address and the data over the common bus with the first memory and the second memory.

7. The memory system of claim 1, wherein each of the first memory and the second memory is configured to communicate a chip enable signal, a write enable signal, a read enable signal, and a data strobe signal with the controller.

8. The memory system of claim 1, wherein the controller is configured to activate a chip enable signal to select one of the first memory and the second memory.

9. The memory system of claim 1, wherein:
the second memory includes a plurality of channels; and
the controller is configured to control each channel of the second memory through the same flash channel.

10. The memory system of claim 1, wherein when selected, each of the first memory and the second memory is configured to generate a clocking data strobe signal in response to a clocking read enable signal from the controller, and transfer the clocking data strobe signal to the controller.

11. The memory system of claim 1, wherein when selected, each of the first memory and the second memory is configured to store a plurality of input signals transferred through the plurality of input/output lines as a command when the command latch enable signal is at an active state and the write enable signal is at an active state.

12. The memory system of claim 1, wherein the flash channel further includes a third line configured to transfer a chip enable signal activating a connected memory,
wherein the controller is configured to transmit a first chip enable signal to the first memory and transmit a second chip enable signal to the second memory respectively,
wherein the controller is configured to transmit the command latch enable signal to the first and second memories in common.

13. The memory system of claim 1, wherein the flash channel further includes a third line configured to transfer a chip enable signal activating a connected memory and a fourth line configured to transfer a data strobe signal,
wherein the controller is configured to transmit a first chip enable signal to the first memory and transmit a second chip enable signal to the second memory respectively,
wherein the controller is configured to transmit the data strobe signal and the data to the first and second memories in common, the data are synched with each of rising and falling edges of the data strobe signal.

14. The memory system of claim 1, wherein the flash channel further includes a third line configured to transfer a chip enable signal activating a connected memory, a fourth line configured to transfer a data strobe signal and a fifth line configured to transfer a read enable signal,
wherein the controller is configured to transmit a first chip enable signal to the first memory and transmit a second chip enable signal to the second memory respectively,
wherein the controller is configured to transmit the read enable signal to the first and second memories in common,
wherein the controller is con figured to receive the data strobe signal and the data from one of the first and second memories, the data being synched with each of rising and falling edges of the data strobe signal.

15. A memory device, comprising:
a memory cell array of a first type;
control circuitry configured to control the memory cell array in response to commands associated with the memory cell array of the first type; and
an interface converter coupled to the control circuitry, configured to communicate with the control circuitry with commands associated with the memory cell array of the first type, and configured to convert between commands associated with a memory cell array of a second type received from an external device into commands associated with the memory cell array of the first type;
wherein the first type and second type are different.

16. The memory device of claim 15, wherein:
the first type is a variable resistance memory; and
the second type is a NAND flash memory.

17. The memory device of claim 15, wherein the interface converter is configured to convert a plurality of data input/output signals, a command latch enable signal, an address latch enable signal, and a write enable signal into corresponding converted signals associated with the first type.

18. The memory device of claim 15, wherein the interface converter is configured to convert a read enable signal to a corresponding converted signal associated with the first type and convert a plurality of data signals and a data strobe signal from converted signals associated with the first type.

19. A method, comprising:
communicating between a controller and a first memory having a first type through a first channel, the first channel being a flash channel; and
communicating between the controller and a second memory having a second type through a second channel, the second channel being the flash channel;
wherein the first memory is a flash memory and the second memory is different from the flash memory.

20. The method of claim 19, wherein a command latch enable signal is transferred to the first and second memories in common from the controller, the command latch enable signal selecting a command input cycle,
wherein an address latch enable signal is transferred to the first and second memories in common from the controller, the address latch enable signal selecting an address input cycle,
wherein a first chip enable signal and a second chip enable signal is transferred to the first and second memories respectively, each of the first and second chip enable signal activating a connected memory.

* * * * *